United States Patent [19]
Deguchi

[11] Patent Number: 6,072,714
[45] Date of Patent: Jun. 6, 2000

[54] STATIC MEMORY CELL WITH A PAIR OF TRANSFER MOS TRANSISTORS, A PAIR OF DRIVER MOS TRANSISTORS AND A PAIR OF LOAD ELEMENTS

[75] Inventor: Koji Deguchi, Hiroshima, Japan

[73] Assignee: NEC Corporation, Tokyo, Japan

[21] Appl. No.: 09/087,648

[22] Filed: May 29, 1998

[30] Foreign Application Priority Data

May 30, 1997 [JP] Japan .................................. 9-141437

[51] Int. Cl.⁷ .................................................. G11C 11/00
[52] U.S. Cl. ............................ 365/154; 365/156; 257/903
[58] Field of Search ................................. 365/154, 156; 257/903, 904

[56] References Cited

U.S. PATENT DOCUMENTS

| 5,225,693 | 7/1993 | Hirayama | 257/904 X |
| 5,241,495 | 8/1993 | Sasaki | 365/154 |
| 5,436,506 | 7/1995 | Kim et al. | |

FOREIGN PATENT DOCUMENTS

| 06169071 | 6/1994 | Japan . |
| 08037241 | 2/1996 | Japan . |

Primary Examiner—Huan Hoang
Attorney, Agent, or Firm—Hutchins, Wheeler & Dittmar, PC

[57] ABSTRACT

A first driver MOS transistor and a second driver MOS transistor are formed at the surface of a semiconductor substrate. A first load element is connected to the drain region of the first driver MOS transistor and the gate electrode of the second driver MOS transistor. A second load element is connected to the drain region of the second driver MOS transistor and the gate electrode of the first driver MOS transistor. A first transfer MOS transistor is formed at the surface, one of the source and drain regions of which is connected to the drain region of the first driver MOS transistor. Further, a second transfer MOS transistor is formed at the surface, one of the source and drain regions of which is connected to the drain region of the second driver MOS transistor. An inter-layer insulation film is formed on the first driver MOS transistor, the second driver MOS transistor, the first transfer MOS transistor and the second transfer MOS transistor. A word line, a first bit line and a second bit line is formed on the inter-layer insulation film. The Word line is connected to the gate electrode of the first transfer MOS transistor and the gate electrode of the second transfer MOS transistor. The first bit line is connected to the other of the source and drain regions of the first transfer MOS transistor. The second bit line is connected to the other of the source and drain regions of the second transfer MOS transistor.

21 Claims, 9 Drawing Sheets

STATIC MEMORY CELL WITH A PAIR OF TRANSFER MOS TRANSISTORS, A PAIR OF DRIVER MOS TRANSISTORS AND A PAIR OF LOAD ELEMENTS

BACKGROUND OF THE INVENTION

1. Field of the Invention

The present invention relates to a static memory cell with a pair of transfer MOS transistors, a pair of driver MOS transistors and a pair of load elements and, particularly, to a static memory cell constructed so as to enhance the operation speed and stability of a semiconductor device.

2. Description of the Related Art

Recently, the mounting density and the degree of integration of semiconductor devices are being more and more increased. Further, the operation of semiconductor devices is being more and more enhanced. Moreover, semiconductor elements such as MOS transistors etc. constituting semiconductor devices are miniaturized; at present, the practical design size thereof is set to about 0.25 μm. For instance, in the case of static memory cells (hereinafter referred to briefly as SRAM) having a MOS structure, as the size of the memory cells is reduced, the operating voltage thereof is lowered, and the operating speed thereof is enhanced. In such a case, it is important not only to enhance the stability in operation of the semiconductor device including SRAM cells but also to lower the manufacturing costs thereof.

First, a SRAM cell will be described below. FIG. 1 is a circuit diagram showing an equivalent circuit of the SRAM cell. As shown in FIG. 1, the SRAM cell is ordinarily comprised of two high-resistance load elements and four N-channel MOS transistors. In this connection, it is added that MOS transistors are used, in stead of such load resistor elements, as the load elements in some cases. In the SRAM cell, the gate of a driver MOS transistor $T_1$ and the drain of a driver MOS transistor $T_2$ are connected to a storage node $N_2$. The gate of the driver MOS transistor $T_2$ and the drain of the driver MOS transistor $T_1$ are connected to a storage node $N_1$. Further, a load resistor element $R_1$ is connected to the storage node $N_1$, and a load resistor element $R_2$ is connected to a storage node $N_2$. A power supply voltage $V_{cc}$ is applied to the other ends of the load resistor elements $R_1$ and $R_2$. On the other hand, the source of the driver MOS transistor $T_1$ and the source of the driver MOS transistor $T_2$ are fixed to an earth potential $V_{ss}$. Then, a flip-flop circuit is composed of the load resistor elements $R_1$ and $R_2$ and the driver MOS transistors $T_1$ and $T_2$.

Further, one of the source and drain of a transfer MOS transistor $T_3$ is connected to the storage node $N_1$, and one of the source and drain of a transfer MOS transistor $T_4$ is connected to the storage node $N_2$. A bit line $BL_1$ is connected to the other of the source and drain of the transfer MOS transistor $T_3$, and a bit line $BL_2$ is connected to the other of the source and drain of the transfer MOS transistor $T_4$. Moreover, a word line WL is connected to the ate of the transfer MOS transistor $T_3$ and the gate of the transfer MOS transistor $T_4$.

Further, one bit portion of storage information is stored in the SRAM cell thus constituted.

Heretofore, in a semiconductor device comprising SRAM cells as mentioned above, the MOS transistors, the load elements, the word line, the bit lines, etc. are disposed so as to be point-symmetrical, respectively, in order to secure the stability in the operation thereof.

FIG. 2 is a schematic drawing showing a typical conventional SRAM cell. In FIG. 2, the power supply wiring, the load resistor elements and the insulation films of the SRAM cell are not shown for the purpose of clarifying the cell pattern structure. Active element regions 102 and 102a are formed at the surface of a semiconductor substrate (not shown) of a silicon substrate or the like point-symmetrically with respect to a point of symmetry C. The active element regions 102 and 102a each have a bent shape and also have straight portions parallel to each other between the active element region 102 and the active element region 102a. Further, the active element regions 102 and 102a are surrounded by an isolating insulator film.

An inner connection portion 104a is formed in the bent portion of the active element region 102, and an inner connection portion 104 is formed in the bent portion of the active element region 102a. A gate electrode 103 of a driver MOS transistor is formed on the active element region 102 through a gate insulation film (not shown). The gate electrode 103 is connected to the active element region 102a through the inner connection portion 104. A gate electrode 103a of a driver MOS transistor is formed on the active element region 102a through a gate insulation film (not shown). The gate electrode 103a is connected to the active element region 102 through the inner connection portion 104a.

Further, a word line 105 is formed in such a manner as to be substantially perpendicular to the gate electrodes 103 and 103a and stride over the active element region 102. Further, a word line 105a is formed in such a manner as to be substantially perpendicular to the gate electrodes 103 and 103a and stride over the active element region 102a. The word lines 105 and 105a serve also as the gate electrodes of transfer MOS transistors.

Diffusion layers are formed in those portions of the active element regions 102 and 102a which are not covered by the gate electrode 103, the gate electrode 103a, the word line 105 or the word line 105a. The diffusion layers become the source and drain regions of n-channel MOS transistors. For instance, in FIG. 2, the portion of the active element region 102 which is located at the right side of the gate electrode 103 is used as the source region of the driver MOS transistor. Further, the portion of the active element region 102 which lies at the side lower than the word line 105 constitutes one of the source and drain of the transfer MOS transistor. Further, the portion of the active element region 102 which lies between the gate electrode 103 and the word line 105 is used as the drain region of the driver MOS transistor and the other of the source and drain of the transfer MOS transistor.

A ground wiring 106 is formed above the gate electrode 103 and the like. An inter-layer insulation film (not shown) having grounding contact holes 107 and 107a at predetermined positions is formed between the ground wiring 106 and the active element regions 102 and 102a, and electrically conductive layers (not shown) are buried in the grounding contact holes 107 and 107a. As a result, the ground wiring 106 is connected to predetermined regions of the diffusion layer in the active element region 102 and the diffusion layer in the active element region 102a.

Further, through not shown, a power supply wiring and a pair of load resistor elements are formed on the ground wiring 106 through the inter-layer insulation film. One end of each of the pair of load resistor elements is electrically connected to the gate electrodes 103 or 103a for the driver MOS transistor through the inner connection portion 104 or 104a. This region corresponds to the node $N_1$ or $N_2$ shown in FIG. 1.

Furthermore, bit line contact holes 108 and 108a are formed, respectively, on the portion of the active element region 102 or 102a constituting one of the source and drain of the transfer MOS transistor. Electrically conductive layers (not shown) are buried in the bit line contact holes 108 and 108a. Further, bit lines 109 and 109a are connected, respectively, to the electrically conductive layer in the bit line contact hole 108 or 108a.

In the conventional SRAM cell having the cell pattern structure thus constituted, the word lines 105 and 105a cross the bit lines 109 and 109a at right angles. Further, the gate electrodes 103 and 103a cross the word lines 105 and 105a at right angles. Furthermore, the channel direction of the driver MOS transistors and the channel direction of the transfer MOS transistors cross each other at right angles. That is, the direction in which the gate electrodes 103 and 103a extend is parallel to the direction in which the bit lines 109 and 109a extend. Thus, the size of the SRAM cell is constituted in such a manner that the SRAM cell is long in the direction in which the bit lines 109 and 109a extend and short in the direction in which the word lines 105 and 105a extend. Therefore, the parasitic capacitance between the bit lines is large. Further, the area over which the ground wiring 106 and the bit lines 109 and 109a overlap each other through the inter-layer insulation film is large, so that the parasitic capacitance between them is also large. Due to the fact that such large parasitic capacitances exist, the enhancement or increase in the operating speed of the semiconductor device on which conventional SRAM cells as mentioned above are mounted has its limit. Furthermore, two word lines are provided in the above-mentioned SRAM cell. This structure will hereinafter be referred to as the split word structure. Due to this structure, the dimensional miniaturization of the SRAM cell is insufficient.

Thus, there has been proposed a SRAM cell in which the pitch between the bit lines is enlarged to enhance the stabilization in low-voltage operation (Japanese Unexamined Patent Publication No. Hei 8-37241). FIG. 3 is a schematic drawing showing the SRAM cell disclosed in Japanese Unexamined Patent Publication No. Hei 8-37241. In FIG. 3, the power supply wiring, the ground wiring and the load resistor elements in the SRAM cell and the insulation films are not shown for the purpose of clarifying the cell pattern structure.

In the SRAM cell disclosed in the above-mentioned publication, active element regions 202 and 202a are formed symmetrically with respect to a point of symmetry D on a semiconductor substrate (not shown) of a silicon substrate or the like. Further, the active element regions 202 and 202a are surrounded by an element isolating insulation film. A gate electrode 203 of a driver MOS transistor is formed on the active element region 202 through a gate insulation film (not shown). The gate electrode 203 is connected to the active element region 202a through an inner connection portion (not shown). Further, a gate electrode 203a of a driver MOS transistor is formed on the active element region 202a through a gate insulation film (not shown). The gate electrode 203a is connected to the active element region 202 through an inner connection portion (not shown).

Further, a word line 204 is formed in a state extending in a direction inclined by 45° with respect to the direction in which the gate electrodes 203 and 203a extend and striding over the active element region 202. Further, a word line 204a is formed in a state extending in a direction inclined by 45° with respect to the direction in which the gate electrodes 203 and 203a extend and striding over the active element region 202a. The word lines 204 and 204a serve also as the gate electrodes of transfer MOS transistors.

Diffusion layers are formed in those portions of the active element regions 202 and 202a which are not covered by the gate electrode 203, the gate electrode 203a, the word line 205 or the word line 205a. The diffusion layers constitute the source and drain regions of the n-channel MOS transistors.

A ground wiring (not shown) is formed above the gate electrode 203 and the like. An inter-layer insulation film (not shown) provided with grounding contact holes 205 and 205a at predetermined positions thereof is formed between the ground wiring and the active element regions 202 and 202a, and electrically conductive layers (not shown) are buried in the grounding contact holes 207 and 207a. As a result, the ground wiring is connected to predetermined portions of the diffusion layer in the active element regions 202 and the diffusion layer in the active element region 202a.

Further, as in the case of the foregoing SRAM cell, a power supply wiring and a pair of load resistor elements are formed on the ground wiring through inter-layer insulation films.

Furthermore, bit line contact holes 206 and 206a are formed, respectively, on the portion of the active element region 202 or 202a constituting the source and drain regions of the transfer MOS transistor. Electrically conductive layers (not shown) are buried in the bit line contact holes 206 or 206a. The bit lines 207 and 207a are connected, respectively, to the electrically conductive layer in the bit line contact hole 206 or 206a.

In the conventional SRAM cell having the cell pattern constituted as mentioned above, the word lines 204 and 204a cross the bit lines 207 and 207a at right angles. The direction in which the gate electrodes 203 and 203a for the driver MOS transistors extend is inclined by about 45° with reference to the direction in which the word lines 204 and 204a extend. Further, the channel direction of the driver MOS transistors and the channel direction of the transfer MOS transistors are directed in substantially the same direction. Thus, the dimension in the bit line direction of this SRAM cell can be shortened with reference to the foregoing conventional SRAM cell.

However, the area of the ground wiring and that of the bit lines which overlap each other through the inter-layer insulation film are still large; and thus, it is difficult to reduce the parasitic capacitance in the whole SRAM cell. Furthermore, the SRAM cell has the split word structure, so that the miniaturization of the SRAM cell is insufficient.

SUMMARY OF THE INVENTION

It is the object of the present invention to provide a static memory cell with a pair of transfer MOS transistors, a pair of driver MOS transistors and a pair of load elements and is constituted in such a manner that the size of the static memory cell can be easily reduced, and the operating speed and stability of the semiconductor device can be enhanced.

The static memory cell according to the present invention with a pair of transfer MOS transistors, a pair of driver MOS transistors and a pair of load elements comprises a first driver MOS transistor and a second driver MOS transistor formed at the surface of a semiconductor substrate. The static memory cell further comprises a first load element connected to the drain region of the first driver MOS transistor and the gate electrode of the second driver MOS transistor, and a second load element connected to the drain region of the second driver MOS transistor and the gate electrode of the first driver MOS transistor. The first driver MOS transistor, the second driver MOS transistor, the first load element and the second load element constitute a flip-flop circuit. Further, the static memory cell comprises a first transfer MOS transistor and a second transfer MOS transistor formed at the surface of the semiconductor substrate, and an inter-layer insulation film formed on the first driver MOS transistor, the second driver MOS transistor, the first transfer MOS transistor and the second transfer MOS transistor. One of the source and drain regions of the first transfer MOS transistor is connected to the drain region of the first driver MOS transistor, one of the source and drain regions of the second transfer MOS transistor is connected to the drain region of the second driver MOS transistor. Furthermore, the static memory cell comprises a word line, a first bit line and a second bit line formed on the inter-layer insulation film. The first bit line is connected to the other of the source and drain regions of the first transfer MOS transfer, and the second bit line is connected to the other of the source and drain regions of the second transfer MOS transistor. The word line is connected to the gate electrode of the first transfer MOS transistor and the gate electrode of the second transfer MOS transistor.

According to the present invention, only one word line is provided in the static memory cell unlike in the case of the conventional split word structure, so that the miniaturization of the static memory cell can be very easily realized.

Further, the area of the ground wiring and the area of the bit lines which overlap each other through the inter-layer insulation films are very small with reference to the case of the conventional static memory cells, so that the parasitic capacitance in the whole memory cell can be reduced. Furthermore, the dimension in the bit line direction of the static memory cell is shortened, and therefore, the parasitic capacitance due to the bit lines is reduced. Thus, it become possible to enhance the degree of integration and the operating speed of a semiconductor device comprising static memory cells as according to the present invention.

The ground wiring, which is connected to the source regions of the first driver MOS transistor and the second driver MOS transistor, may be formed of the same electrically conductive layer which forms the word line or the same electrically conductive layer which forms the bit lines. In this case, the number of manufacturing steps can be reduced to lower the costs.

DETAILED DESCRIPTION OF THE PREFERRED EMBODIMENTS

Figure 1:
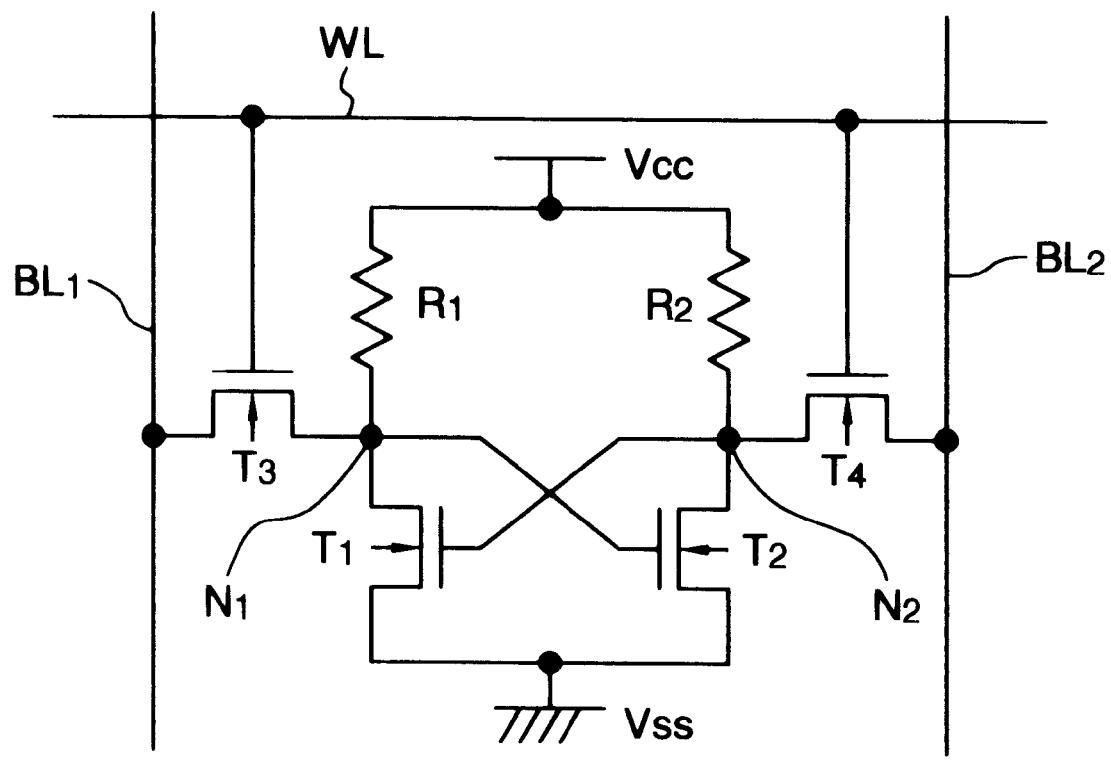
FIG. 1 is a circuit diagram showing an equivalent circuit of a SRAM cell.
Figure 2:
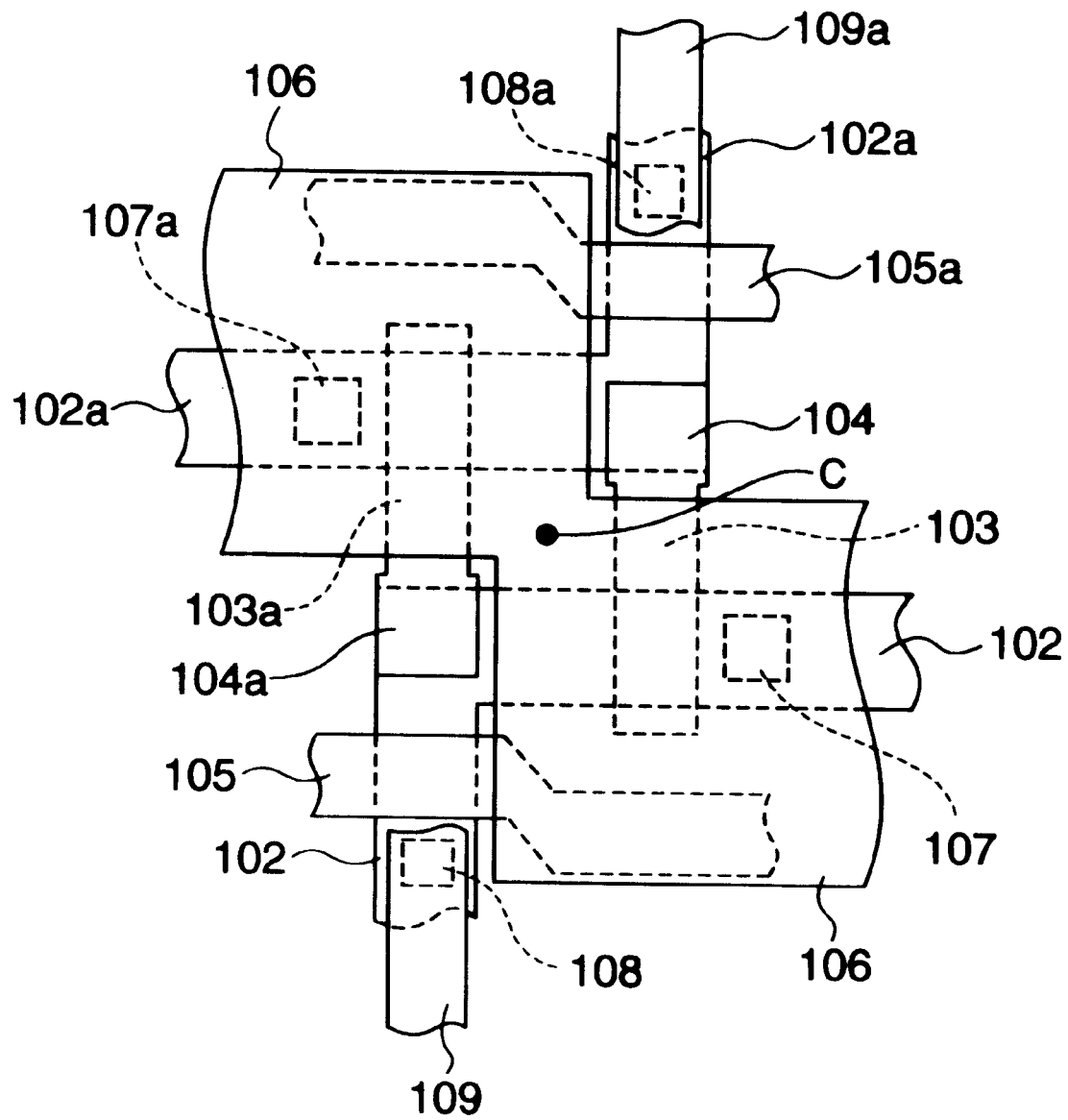
FIG. 2 is a schematic drawing showing a typical conventional SRAM cell.
Figure 3:
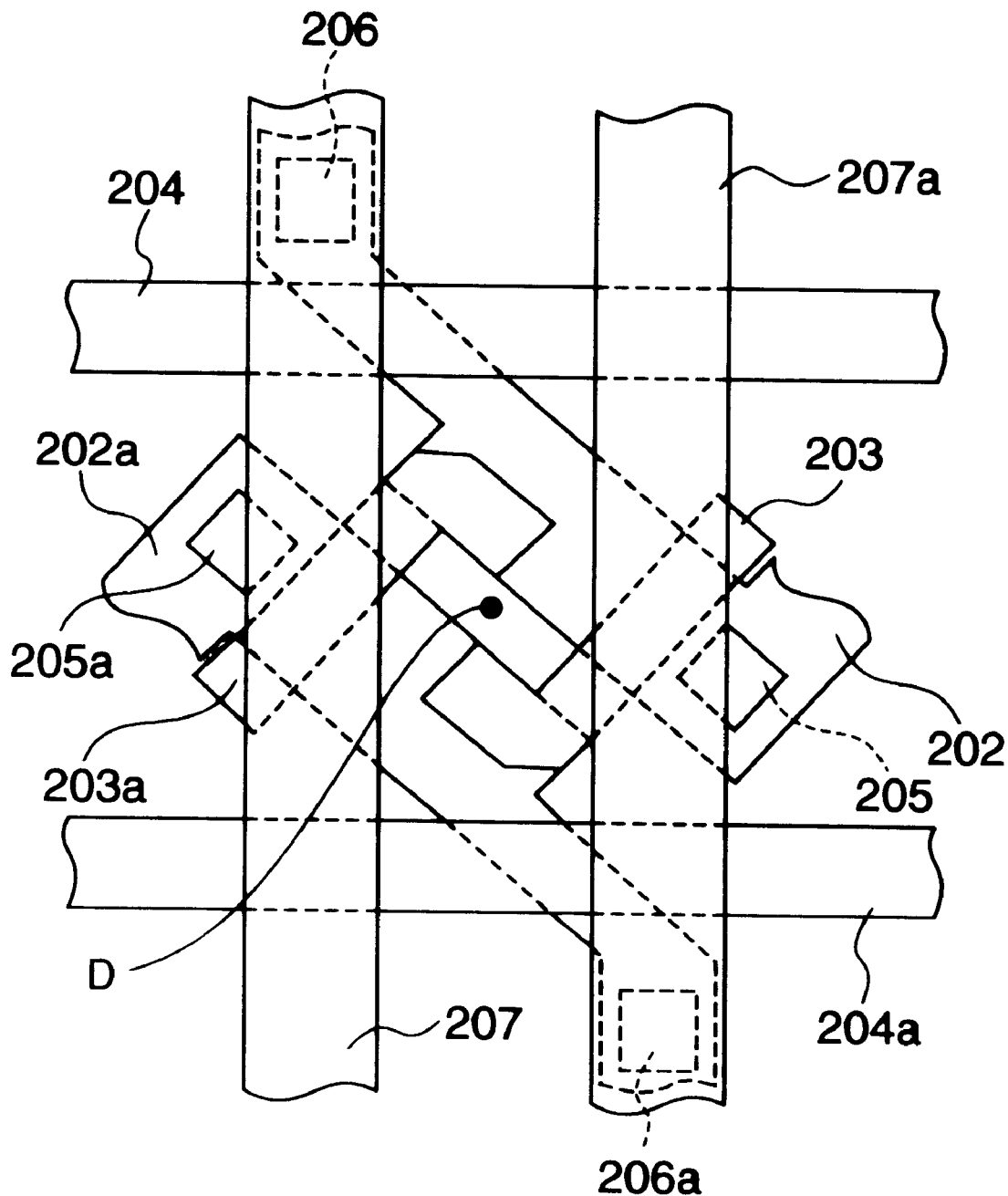
FIG. 3 is a schematic drawing showing the SRAM cell disclosed in Japanese Unexamined Patent Publication No. Hei 8-37241.
Figure 4:
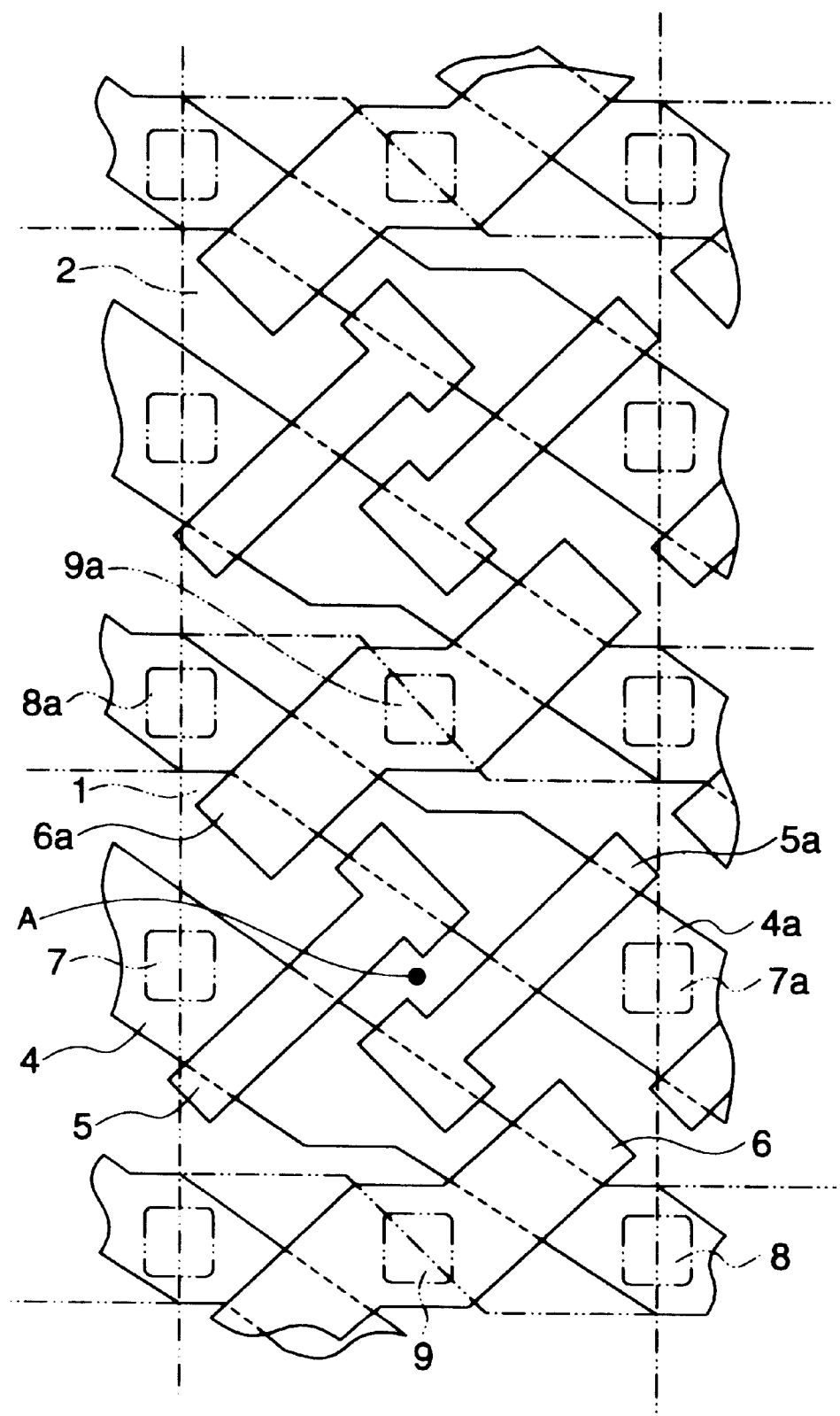
FIG. 4 is a schematic drawing showing the positional arrangement of the active element regions, the gate electrodes of the driver MOS transistors and the gate electrodes of the transfer MOS transistors in the SRAM cell according to a first embodiment of the present invention.

The static memory cells according to the embodiments of the present invention will now be described by reference to the accompanying drawings. FIG. 4 is a schematic drawing showing the positional arrangement of the active element regions, the gate electrodes of the driver MOS transistors and the gate electrodes of the transfer MOS transistors in the SRAM cell according to a first embodiment of the present invention. In FIG. 4, a plurality of SRAM cells, which all have the same structure according to the first embodiment of the present invention, are regularly disposed, but the insulation films are not shown.

Referring to FIG. 4, a second SRAM cell which has the same structure as a first SRAM cell 1 is disposed above—in the drawing plane—and adjacent to the first SRAM cell 1. Further, SRAM cells which each have the same structure as the first SRAM cell 1 are disposed adjacent to the first SRAM cell 1 at both sides and the lower side—in the drawing plane—of the first SRAM cell 1. Then, this arrangement is repeated a predetermined number of times.

The first SRAM cell 1 will now be described. In the first SRAM cell 1, a first active element region 4 and a second active element region 4a which extend in directions substantially parallel to each other are formed symmetrically with reference to a point of symmetry A at the surface of a semiconductor substrate (not shown) of a silicon substrate or the like. Further, the active element regions 4 and 4a are surrounded by an element isolating insulation film.

A first driver gate electrode 5 of a first driver MOS transistor is formed on the first active element region 4 through a gate insulation film (not shown). The first driver gate electrode 5 is connected to the second active element region 4a through a first inner connection portion (not shown). Further, a second driver gate electrode 5a of a second driver MOS transistor is formed on the second active element region 4a through a gate insulation film (not shown). The second driver gate electrode 5a is connected to the first active element region 4 through a second inner connection portion (not shown).

Further, a first transfer gate electrode 6 of a first transfer MOS transistor is formed in a state extending in a direction parallel to the direction in which the driver gate electrodes 5 and 5a extend and striding over the first active element region 4. Then, on the first active element region 4, the second driver gate electrode 5a is sandwiched between the first driver gate electrode 5 and the first transfer gate electrode 6. Further, a second transfer gate electrode 6a of a second transfer MOS transistor is formed in a state extending in a direction parallel to the direction in which the driver gate electrodes 5 and 5a extend and striding over the second active element region 4a. Then, on the second active element region 4a, the first driver gate electrode 5 is sandwiched between the second driver gate electrode 5a and the second transfer gate electrode 6a.

In this way, each of the gate electrodes are formed as an isolated pattern.

Diffusion layers are formed in those portions of the active element regions 4 and 4a which are not covered by the first driver gate electrode 5, the second driver gate electrode 5a, the first transfer gate electrode 6 or the second transfer gate electrode 6a. The diffusion layers thus formed constitute the source and drain regions of the n-channel MOS transistors. For instance, in FIG. 4, the portion of the first active element region 4 which lies outside the first driver gate electrode 5 constitutes the source region of the first driver MOS transistor. On the other hand, the portion of the first active element region 4 which lies outside the first transfer gate electrode 6 constitutes one of the source and drain of the first transfer MOS transistor. Further, the portion of the first active element region 4 which lies between the first driver gate electrode 5 and the first transfer gate electrode 6 constitutes the drain region of the first driver MOS transistor and the other of the source and drain of the first transfer MOS transistor. In the second active element region 4a, source and drain regions and the like are formed symmetrically, with reference to the point of symmetry A, to those in the first active element region 4.

A grounding contact hole 7 for a ground wiring is formed in an inter-layer insulation film on the portion of the first active element region 4 which lies outside the first driver gate electrode 5. Further, a grounding contact hole 7a is formed in the inter-layer insulation film on the portion of the second active element region 4a which lies outside the second driver gate electrode 5a.

Further, a bit line contact hole 8 for a bit line is formed in the inter-layer insulation film on the portion of the first active element region 4 which lies outside the first transfer gate electrode 6. A bit line control hole 8a for a bit line is formed in the inter-layer insulation film on the portion of the second active element region 4a which lies outside the second transfer gate electrode 6a.

Furthermore, a word line contact hole 9 for a word line is formed in the inner-layer insulation film on the first transfer gate electrode 6, and a word line contact hole 9a for a word line is formed in the inter-layer insulation film on the second transfer gate electrode 6a.

All the contact holes mentioned above are used commonly by one of the adjacent SRAM cells.

Figure 5:
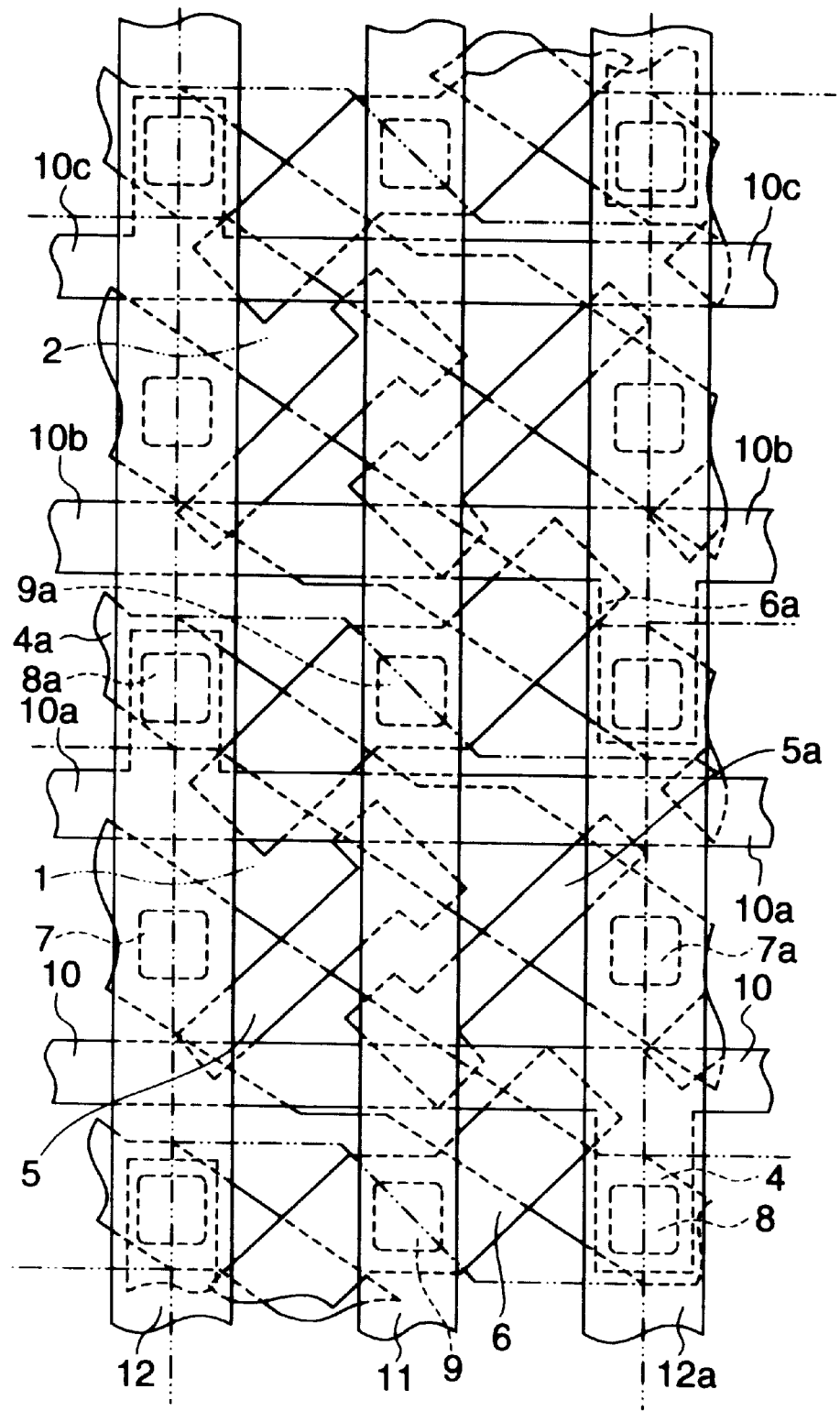
FIG. 5 is a schematic drawing showing the positional arrangement of the wiring layers in the SRAM cell according to the first embodiment of the present invention.

FIG. 5 is a schematic drawing showing the positional arrangement of the wiring layers in the SRAM cell according to the first embodiment of the present invention. In FIG. 5, the same component parts or elements as those shown in FIG. 4 are referenced by the same reference numerals and symbols, whereby the repetition of the detailed description thereof is omitted. Further, the insulation films are not shown. The inter-layer insulation film (not shown) having the contact holes is formed on the first driver gate electrode 5, the second driver gate electrode 5a, the first transfer gate electrode 6 and the second transfer gate electrode 6a. As shown in FIG. 5, a first bit line 10 which extends laterally in the drawing plane is formed on the first driver gate electrode 5, and the second driver gate electrode 5a, the first transfer gate electrode 6 through the inter-layer insulation films. Further, a second bit line 10a is formed, in parallel to the first bit line 10, on the first driver gate electrode 5, the second driver gate electrode 5a, and the second transfer gate electrode 6a through the inter-layer insulation film. In the second SRAM cell 2, a first bit line 10b and a second bit line 10c are formed in the same manner as in the case of the first SRAM cell 1.

Electrically conductive layers (not shown) are buried in the bit line contact holes 8 and 8a. The first bit line 10 is connected to the diffusion layer in the first active element region 4, and the second bit line 10a is connected to the diffusion layer in the second active element region 4a through the electrically conductive layers. Thus, the pair of bit lines in the first SRAM cell 1 are comprised of the first bit line 10 and the second bit line 10a. The pair of bit lines in the second SRAM cell 2 are comprised of the first bit line 10b and the second bit line 10c.

Further, the inter-layer insulation film (not shown) having the grounding contact holes and the word line contact holes is formed on the bit lines 10 and 10a. A word line 11 extending vertically in the drawing plane and crossing the bit lines 10 and 10a at right angles is formed on the bit lines 10 and 10a through the inter-layer insulation film. Electrically conductive layers (not shown) are buried in the word line contact holes 9 and 9a. The word line 11 is connected to the first transfer gate electrode 6 and the second transfer gate electrode 6a through the electrically conductive layers.

Ground wirings 12 and 12a which extend in the vertical direction in the drawing plane and cross the bit lines 10 and 10a at right angles are formed on the bit lines 10 and 10a through the inter-layer insulation film same as the word line 11. Electrically conductive layers (not shown) are buried in the grounding contact holes 7 and 7a. The ground wiring 12 is connected to the diffusion layer in the first active element region 4, and the ground wiring 12a is connected to the diffusion layer in the second active element region 4a through the electrically conductive layers.

Thus, according to this embodiment, the direction in which the word line 11, the ground wiring 12 and the ground wiring 12a extend is orthogonal to the direction in which the bit lines 10 and 10a extend. In the second SRAM cell 2, the word line 11 and the ground wirings 12 and 12a are connected to the transfer gate electrodes etc. in the same manner as in the case of the first SRAM cell 1.

The word line 11, the ground wiring 12 and the ground wiring 12a are formed by patterning one and the same electrically conductive layer. For instance, a metal film composed of aluminum or aluminum alloy or a refractory metal film composed of tungsten or the like is used as the electrically conductive layers. Further, the bit lines 10, 10a, 10b and 10c are also formed of a metal film composed of aluminum or aluminum alloy or a refractory metal film composed of tungsten or the like.

Furthermore, through not shown, a power supply wiring is formed in the same manner as in the case of the conventional SRAM cell. For instance, the power supply wiring etc. are formed as layers lying beneath the bit lines 10, 10a, 10b and 10c mentioned above. A load resistor element (not shown) is connected to the portion of the first active element region 4 which lies between the first driver gate electrode 5 and the first transfer gate electrode 6. Another load resistor element (not shown) is connected to the portion of the first active element region 4a which lies between the first driver gate electrode 5a and the first transfer gate electrode 6a.

In the case of the thus constituted SRAM cell according to the first embodiment, only one word line 11 is provided in one SRAM. That is, this SRAM cell is not of the split word structure on which the conventional SRAM cell is based. Therefore, the SRAM cell according to the first embodiment can be reduced in size very easily.

Further, the word line 11, the ground wiring 12 and the ground wiring 12a are formed by the use of the same electrically conductive layer, so that the number of steps for manufacturing the semiconductor device can be reduced to lower the manufacturing costs thereof.

The direction in which the gate electrodes such as the first driver gate electrode 5 and the like extend is inclined by about 45°, for example, with reference to the directions in which the word line 11, the first bit line 10, etc. extend. Due to this structure, the dimension of the bit lines in the direction in which they extend is shortened, so that the parasitic capacitance due to the bit lines is reduced.

Further, each of the first driver gate electrode 5, the second driver gate electrode 5a, the first transfer gate electrode 6 and the second transfer gate electrode 6a has the pattern of an isolated shape. Due to this structure, the first driver gate electrode 5, the second driver gate electrode 5a, the first transfer gate electrode 6 and the second transfer gate electrode 6a can be processed or worked on one and the same condition. Thus, the degree of widening or thinning of the pattern in the photolithographic step becomes approximately uniform. Accordingly, the variation in the capability ratio between the driver MOS transistors and the transfer MOS transistors is suppressed.

Figure 6:
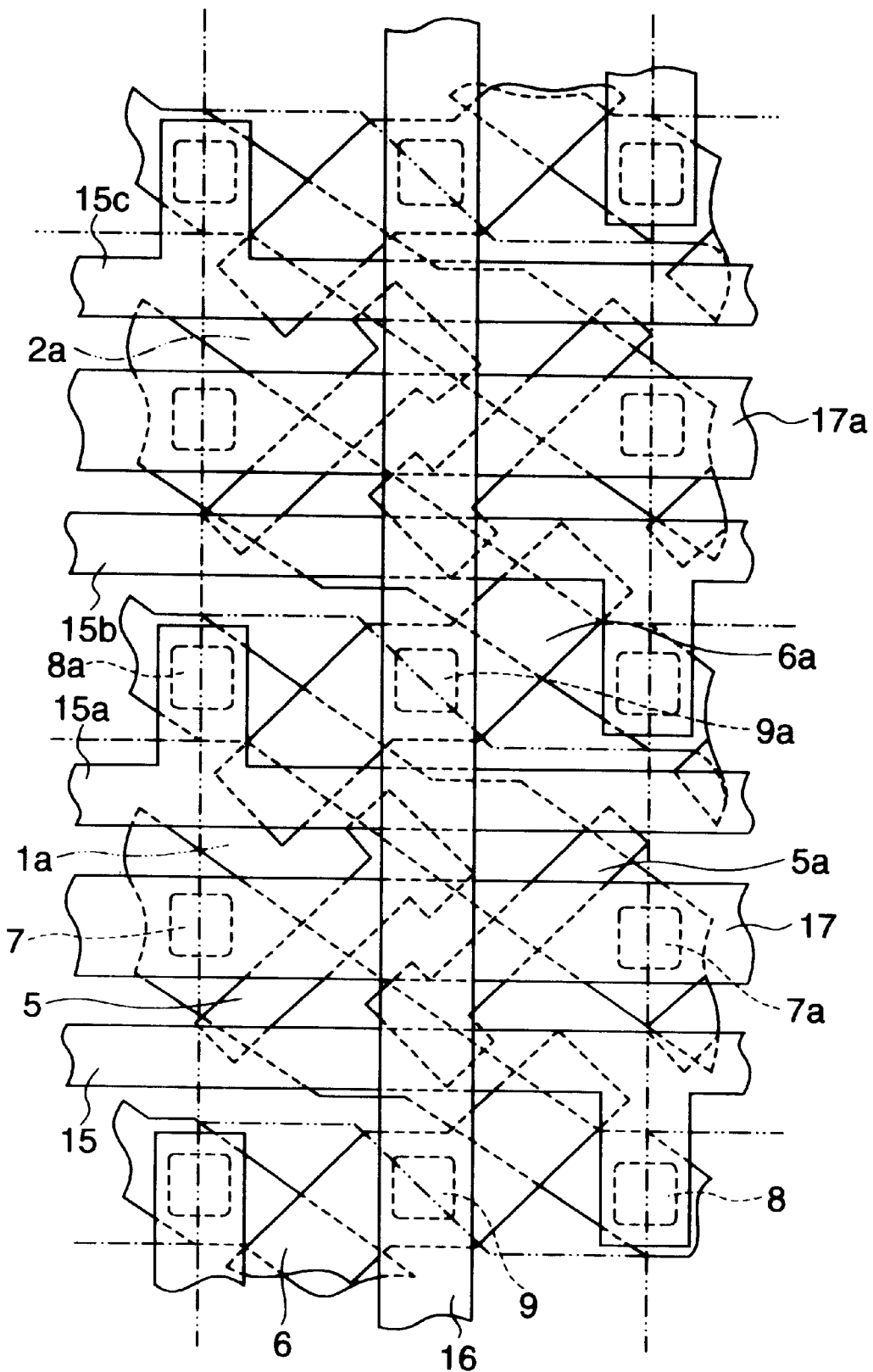
FIG. 6 is a schematic drawing showing the positional arrangement of the wiring layers in the SRAM cell according to a second embodiment of the present invention.

Next, a second embodiment of the present invention will be described below. Active element regions, driver gate electrodes and transfer gate electrodes are disposed as in the case of the first embodiment. Further, bit lines and ground wirings are formed of the same electrically conductive layer, and a word line is formed of an electrically conductive layer which differs from the above-mentioned electrically conductive layer. FIG. 6 is a schematic drawing showing the positional arrangement of the wiring layers in the SRAM cell according to the second embodiment of the present invention. In FIG. 6, the same component parts or portions as those shown in FIG. 4 are referenced by the same reference numerals and symbols, whereby the repetition of the detailed description thereof is omitted. Further, the insulation films are not shown. In the description to follow, those points at which the second embodiment differs from the first embodiment will mainly be described. As shown in FIG. 6, in a first SRAM cell 1a, a first bit line 15 which extends laterally in the drawing plane is formed on the first driver gate electrode 5, the second driver gate electrode 5a and the first transfer gate electrode 6 through an inter-layer insulation film. A second bit line 15a is formed in a state extending in parallel to the first bit line 15, on the first driver gate electrode 5, the second driver gate electrode 5a and the second transfer gate electrode 6a through the inter-layer insulation film. Also in a second SRAM cell 2a, a first bit line 15b and a second bit line 15c are formed in the same manner as in the first SRAM cell 1a.

Electrically conductive layers (not shown) are buried in the bit lines contact holes 8 and 8a. The first bit line 15 is connected to the diffusion layer in the first active element region 4, and the second bit line 15a is connected to the diffusion layer in the second active element region 4a through the electrically conductive layers. In this way, the pair of bit lines in the first SRAM cell 1a are comprised of the first bit line 15 and the second bit line 5a. The pair of bit lines in the second SRAM cell 2a are comprised of the first bit line 15b and the second bit line 15c.

Further, a ground wiring 17 which extends laterally in the drawing plane is formed on the first driver gate electrode 5 and the second driver gate electrode 5a through the inter-layer insulation film in the same manner as in the case of the bit lines 15 and 15a. Electrically conductive layers (not shown) are buried in grounding contact holes 7 and 7a, so that the ground wiring 17 is connected to the diffusion layer in the first active element region 4 and the diffusion layer in the second active element region 4a through these electrically conductive layers.

Further, an inter-layer insulation film (not shown) having the word line contact holes 9 and 9a is formed on the first bit line 15, the second bit line 15a and the ground wiring 17. A word line 16 which extends in the vertical direction in the drawing plane and crosses the first bit line 15, the second bit line 15a and the ground wiring 17 at right angles is formed on the first bit line 15, the second bit line 15a and the ground wiring 17 through the inter-layer insulation film. Electrically conductive layers (not shown) are buried in the word line contact holes 9 and 9a. The word line 16 is connected to the first transfer gate electrode 6 and the second transfer gate electrode 6a through the electrically conductive layers.

In this way, according to this second embodiment, the direction in which the word line 16 extends is orthogonal to the direction in which the first bit line 15, the second bit line 15a and the ground wiring 17 extend. Further, in the second SRAM cell 2a, the word line 16 and a ground wiring 17a are connected to the transfer gate electrodes etc. in the same manner as in the case of the first SRAM cell 1a.

The first bit line 15, the second bit line 15a and the ground wiring 17 are formed by patterning the same electrically conductive layer. As the electrically conductive layer, for instance, a metal film composed of aluminum or aluminum alloy or a refractory metal film composed of tungsten or the like can be pointed out. Further, the word line 16 is also formed of, for instance, a metal film composed of aluminum or aluminum alloy or a refractory metal film composed of tungsten or the like.

The word line may alternatively be formed as a layer lying beneath the bit lines and the ground wiring through an inter-layer insulation film.

Furthermore, through not shown, a power supply wiring is formed in the same manner as in the case of the conventional SRAM cell. For instance, the power supply wiring etc. are formed as layers lying beneath the bit lines 15, 15a, 15b and 15c mentioned above. A load resistor element (not shown) is connected to the portion of the first active element region 4 which lies between the first driver gate electrode 5 and the first transfer gate electrode 6. Another load resistor element (not shown) is connected to the portion of the first active element region 4a which lies between the first driver gate electrode 5a and the first transfer gate electrode 6a.

In the case of the SRAM cell according to the second embodiment, which is constructed as mentioned above, only one word line 16 is provided in each SRAM cell. Due to this structure, the SRAM cell can be reduced in size very easily.

Further, since the ground wiring 17, the first bit line 15 and the second bit line 15a are formed of one and the same electrically conductive layer, the parasitic capacitance in the whole SRAM cell due to the bit lines can be reduced to a substantial degree. Therefore, it becomes very easy to enhance the operating speed of the semiconductor device comprising the SRAM cells according to this embodiment.

It should be noted that a word line might be formed in a layer beneath a layer in which bit lined are formed.

Figure 7:
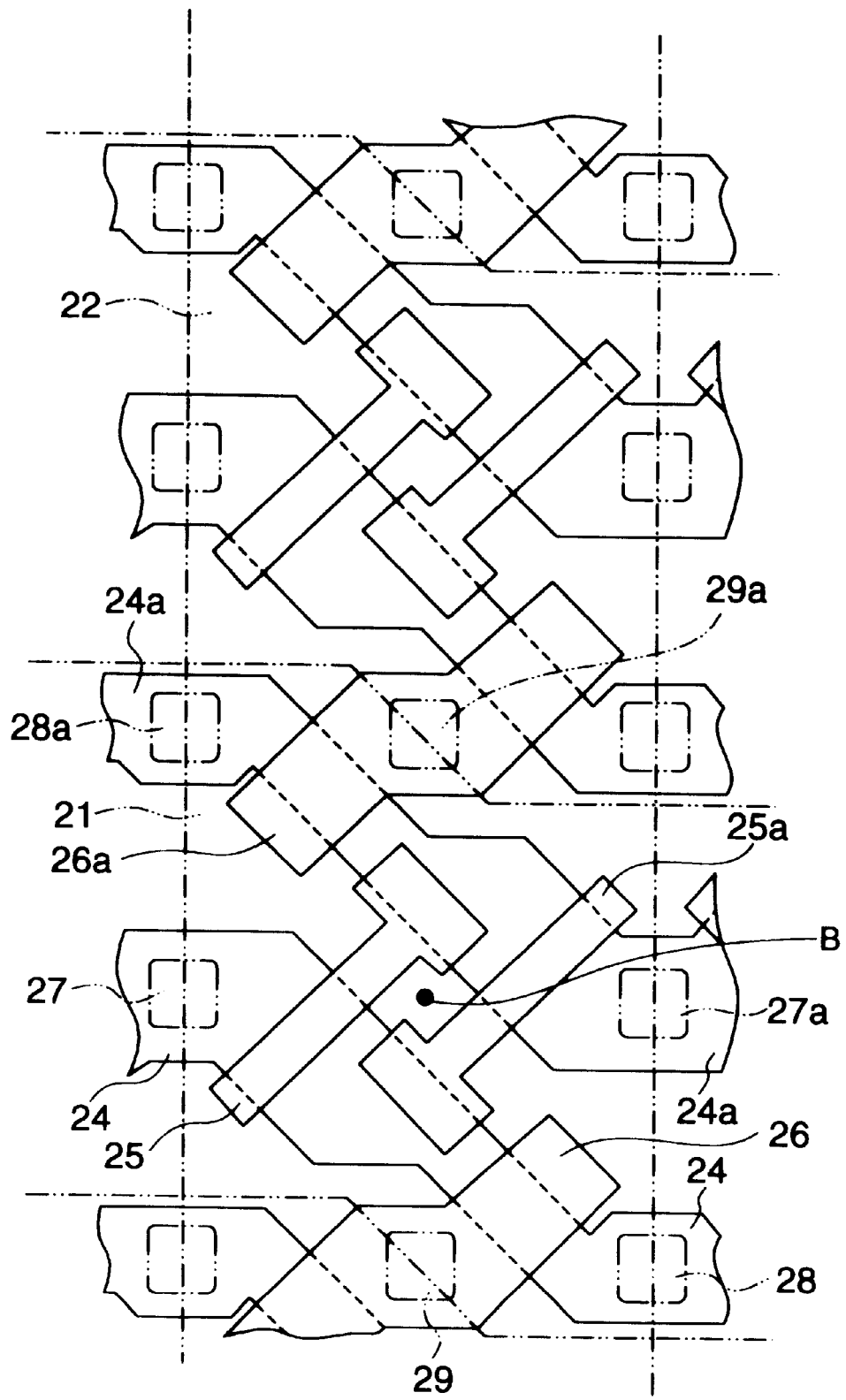
FIG. 7 is a schematic drawing showing the positional arrangement of the active element regions, the gate electrodes of the driver MOS transistors, and the gate electrodes of the transfer MOS transistors in the SRAM cell according to a third embodiment of the present invention.

Next, a third embodiment of the present invention will be described. FIG. 7 is a schematic drawing showing the positional arrangement of the active element regions, the gate electrodes of the driver MOS transistors and the gate electrodes of the transfer MOS transistors in the SRAM cell according to the third embodiment. In FIG. 7, a plurality of SRAM cells each having the same structure and a plurality of SRAM cells each having the same structure corresponding to the structure of the cells inverted laterally on the drawing plane are regularly disposed, and the insulation films are not shown.

As shown in FIG. 7, a second SRAM cell 22 which has the same structure as a first SRAM cell 21 is disposed above—in the drawing plane—and adjacent to the first SRAM cell 21. Further, SRAM cells which each have a structure corresponding to the structure of the first SRAM cell 21 inverted laterally on the drawing plane are disposed adjacent, at both lateral sides in the drawing plane, to the first SRAM cell 21. Further, a SRAM cell which has the same structure as the first SRAM cell 21 is disposed adjacent, at the lower side in the drawing plane, to the first SRAM cell 21. The above-mentioned arrangement of SRAM cells is repeated a predetermined number of times.

The first SRAM cell 21 will now be described. In the first SRAM cell 21, a first active element region 24 and a second active element region 24a which extend in directions substantially parallel to each other are formed symmetrically with reference to a point of symmetry B at the surface of a semiconductor substrate (not shown) of a silicon substrate or the like. Each of the active element regions 24 and 24a has a shape meandering at 2-memory period. Further, the active element regions 24 and 24a are surrounded by an element isolating insulation film.

A first driver gate electrode 25 of a first driver MOS transistor is formed on the first active element region 24 through a gate insulation film (not shown). The first driver gate electrode 25 is connected to the second active element region 24a through a first inner connection portion (not shown). Further, a second driver gate electrode 25a of a second driver MOS transistor is formed on the second active element region 24a through a gate insulation film (not shown). The second driver gate electrode 25a is connected to the first active element region 24 through a second inner connection portion (not shown).

Further, a first transfer gate electrode 26 of a first transfer MOS transistor is formed in a state extending in a direction parallel to the direction in which the driver gate electrodes 25 and 25a extend and striding over the first active element region 24. Then, on the first active element region 24, the second driver gate electrode 25a is sandwiched between the first driver gate electrode 25 and the first transfer gate electrode 26. Further, a second transfer gate electrode 26a of a second transfer MOS transistor is formed in a state extending in a direction parallel to the direction in which the driver gate electrode 25 and 25a extend and striding over the second active element region 24a. Then, on the second active element region 24a, the first driver gate electrode 25 is sandwiched between the second driver gate electrode 25a and the second transfer gate electrode 26a.

In this way, each of the gate electrodes are formed in an isolated pattern.

Diffusion layers are formed in those portions of the active element regions 24 and 24a which are not covered by the first driver gate electrode 25, the second driver gate electrode 25a, and the first transfer gate electrode 26 or the second transfer gate electrode 26a. The diffusion layers constitute the source and drain regions of the n-channel MOS transistors. For instance, in FIG. 7, the portion of the first active element region 24 which lies outside the first driver gate electrode 25 constitutes the source region of the first driver MOS transistor. On the other hand, the portion of the first active element region 24 which lies outside the first transfer gate electrode 26 constitutes one of the source and drain of the first transfer MOS transistor. The portion of the first active element region 24 which lies between the first driver gate electrode 25 and the first transfer gate electrode 26 constitutes the drain region of the first driver MOS transistor and the other of the source and drain of the first transfer MOS transistor. In the second active element region 24a, source and drain regions and the like are formed symmetrically, with reference to the point of symmetry B, to those in the first active element region 24.

A grounding contact hole 27 is formed in an interlayer insulation film on the portion of the first active element region 24 which lies outside the first driver gate electrode 25. Moreover, a grounding contact hole 27a is formed in the inter-layer insulation film on the portion of the second active element region 24a which lies outside the second driver gate electrode 25a.

Further, a bit line contact hole 28 for a bit line is formed in the inter-layer insulation film on the portion of the first active element region 24 which lies outside the first transfer gate electrode 26. A bit line contact hole 28a for a bit line is formed in the inter-layer insulation film on the portion of the second active element region 24a which lies outside the second transfer gate electrode 26a.

Furthermore, a word line contact hole 29 for a word line is formed in the inter-layer insulation film on the first transfer gate electrode 26, and a word line contact hole 29a is formed in the inter-layer insulation film on the second transfer gate electrode 26a.

Figure 8:
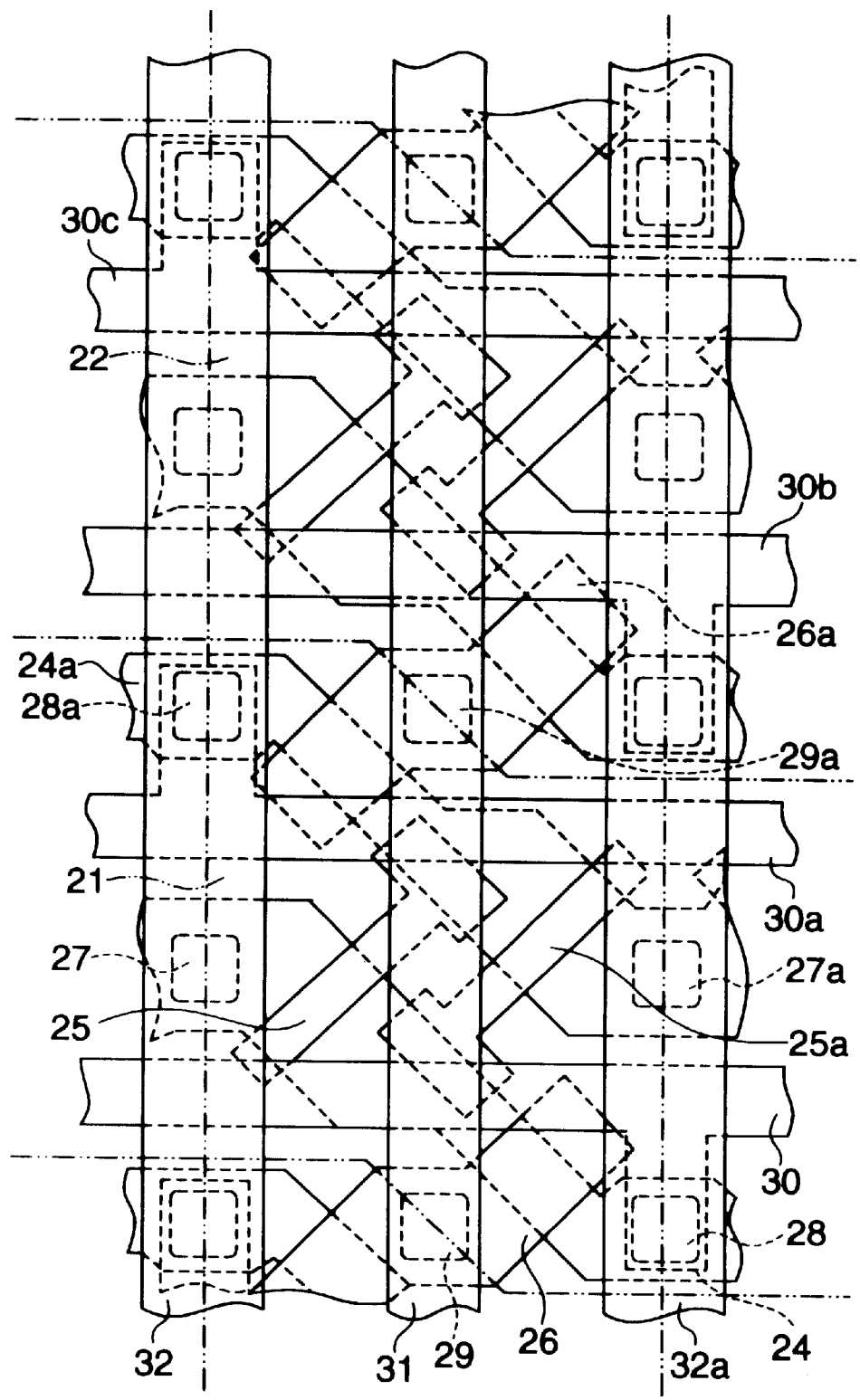
FIG. 8 is a schematic drawing showing the positional arrangement of the wiring layers in the SRAM cell according to the third embodiment of the present invention.

FIG. 8 is a schematic drawing showing the positional arrangement of the wiring layers in the SRAM cell according to the third embodiment of the present invention. In FIG. 8, the same component parts or portions as those shown in FIG. 7 are referenced by the same reference numerals and symbols, whereby the repetition of the detailed description thereof is omitted. Further, the insulation films are not shown. The inter-layer insulation film (not shown) having the contact holes is formed on the first driver gate electrode 25, the second driver gate electrode 25a, the first transfer gate electrode 26 and the second transfer gate electrode 26a. As shown in FIG. 8, a first bit line 30 which extends laterally in the drawing plane is formed on the first driver gate electrode 25, the second driver gate electrode 25a and the first transfer gate electrode 26 through the inter-layer insulation film. Further, a second bit line 30a is formed on the first driver gate electrode 25, the second driver gate electrode 25a and the second transfer gate electrode 26a in a state extending in parallel to the first bit line 30 through the inter-layer insulation film. Also in the second SRAM cell 22, a first bit line 30b and a second bit line 30c are formed in the same manner as in the case of the first SRAM cell 21.

Electrically conductive layers (not shown) are buried in the bit line contact holes 28 and 28a. The first bit line 30 is connected to the diffusion layer in the first active element region 24, and the second bit line 30a is connected to the diffusion layer in the second active element region 24a through the electrically conductive layers. Thus, the first bit line 30 and the second bit line 30a constitute the pair of bit lines in the first SRAM cell 21. The first bit line 30b and the second bit line 30c constitute the pair of bit lines in the second SRAM cell 22.

Further, the inter-layer insulation film (not shown) having the grounding contact holes and the word line contact holes is formed on the bit lines 30 and 30a. A word line 31 which extends in the vertical direction in the drawing plane and crosses the bit lines 30 and 30a at right angles is formed on the bit lines 30 and 30a through the inter-layer insulation film. Electrically conductive layers (not shown) are buried in the word line contact holes 29 and 29a, so that the word line 31 is connected to the first transfer gate electrode 26 and the second transfer gate electrode 26a through the electrically conductive layers.

Ground wirings 32 and 32a which extend vertically in the drawing plane and cross the bit lines 30 and 30a at right angles are formed on the bit lines 30 and 30a through the inter-layer insulation film same as the word line 31. Electrically conductive layers (not shown) are buried in the grounding contact holes 27 and 27a. The ground wiring 32 is connected to the diffusion layer in the first active element region 24, and the ground wiring 32a is connected to the diffusion layer in the second active element region 24a through the electrically conductive layers.

Thus, according to this embodiment, the direction in which the word line 31, the ground wiring 32 and the ground wiring 32a extend is orthogonal to the direction in which the bit lines 30 and 30a extend. In the second SRAM cell 22, the word line 31 and the ground wirings 32 and 32a are connected to the transfer gate electrodes etc. in the same manner as in the case of the first SRAM cell 21. Moreover, as in the case of the first embodiment, the word line 31, the ground wiring 32 and the ground wiring 32a are formed by patterning the same electrically conductive layer.

Furthermore, through not shown, a power supply wiring is formed in the same manner as in the case of the conventional SRAM cell. For instance, the power supply wiring etc. are formed as layers lying beneath the bit lines 30, 30a, 30b and 30c mentioned above. A load resistor element (not shown) is connected to the portion of the first active element region 24 which lies between the first driver gate electrode 25 and the first transfer gate electrode 26. Another load resistor element (not shown) is connected to the portion of the first active element region 24a which lies between the first driver gate electrode 25a and the first transfer gate electrode 26a.

In the case of the thus formed SRAM cells according to the third embodiment, only one word line 31 is provided in one SRAM cell. Therefore, the miniaturization in size of the SRAM cell can be effected very easily.

The area of the ground wiring 32 or 32a and the area of the first bit line 30 or the second bit line 30a which overlap each other are very small as compared with the case of the conventional SRAM cell. Thus, the parasitic capacitance of the whole cell is reduced, and the operating speed of the semiconductor device comprising the SRAM cells can be enhanced very easily.

Further, since the word line 31, the ground wiring 32 and the ground wiring 32a are formed of one and the same electrically conductive layer, it is possible to reduce the number of steps for manufacturing the semiconductor device and thus to lower the manufacturing costs thereof.

Figure 9:
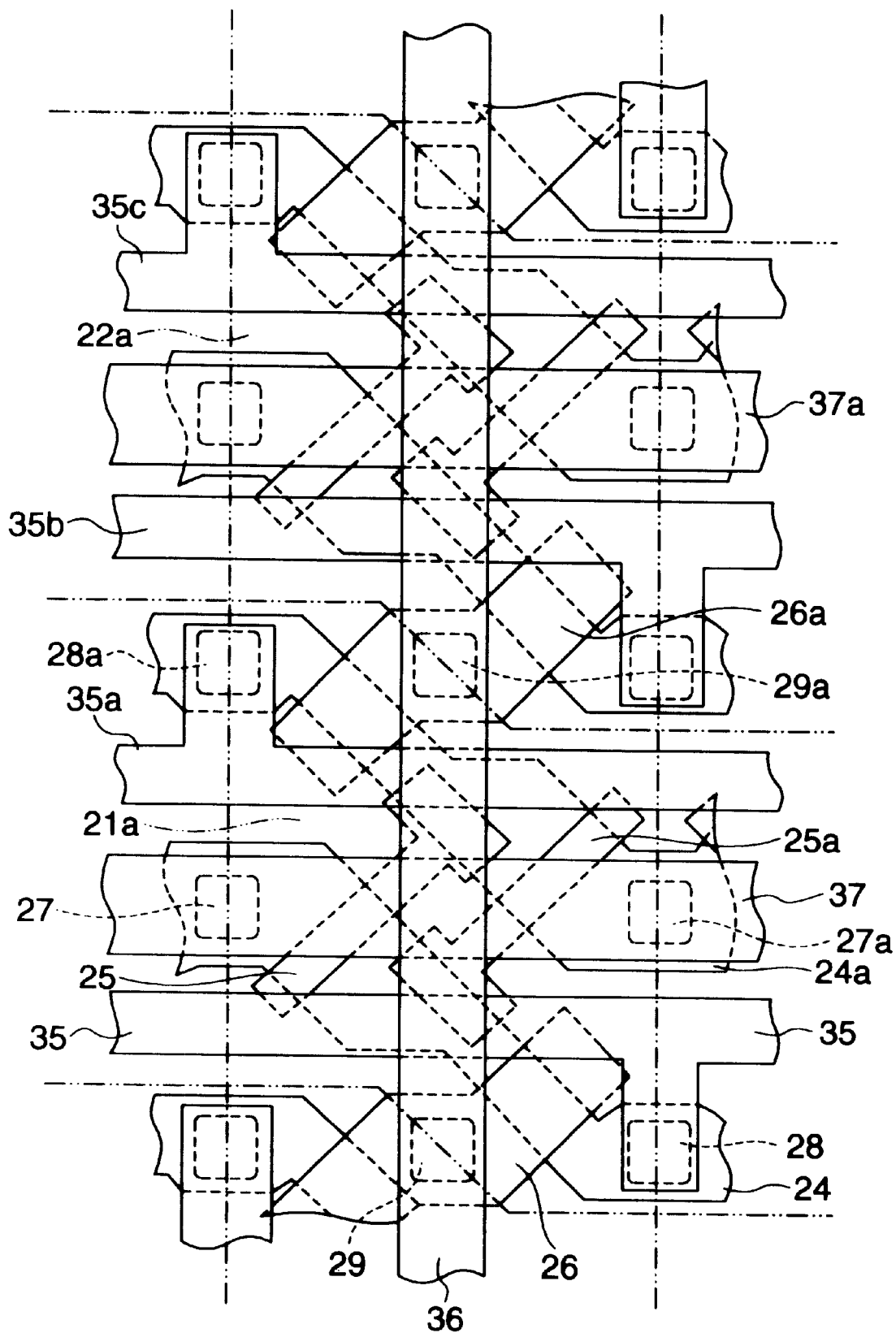
FIG. 9 is a schematic drawing showing the positional arrangement of the wiring layers in the SRAM cell according to a fourth embodiment of the present invention.

Next, a fourth embodiment of the present invention will be described. As in the case of the third embodiment, active element regions, driver gate electrodes and transfer gate electrodes are disposed. Further, bit lines and ground wirings are formed of the same electrically conductive layer, and a word line is formed of an electrically conductive layer which differs from the above-mentioned electrically conductive layer. FIG. 9 is a schematic drawing showing the positional arrangement of the wiring layers in the SRAM cell according to a fourth embodiment of the present invention. In FIG. 9, the same component parts or portions as those shown in FIG. 7 are referenced by the same reference numerals and symbols, whereby the repetition of the detailed description thereof is omitted. Further, the insulation films are not shown. In the description to follow, those points at which the fourth embodiment differs from the third embodiment will mainly be described. As shown in FIG. 9, in a first SRAM cell 21a, a first bit line 35 which extends laterally in the drawing plane is formed on the first driver gate electrode 25, the second driver gate electrode 25a and the first transfer gate electrode 26 through an inter-layer insulation film. A second bit line 35a which extends in parallel to the first bit line 35 is formed on the first driver gate electrode 25, the second driver gate electrode 25a and the second transfer gate electrode 26a through the inter-layer insulation film. Also in a second SRAM cell 22a, a first bit line 35b and a second bit line 35c are formed in the same manner as in the first SRAM cell 21a.

Electrically conductive layers (not shown) are buried in the bit line contact holes 28 and 28b. The first bit line 35 is connected to the diffusion layer in the first active element region 24, and the second bit line 35a is connected to the diffusion layer in the second active element region 24a through the electrically conductive layers. In this way, the first bit line 35 and the second bit line 35a constitute the pair of bit lines in the first SRAM cell 21a. The first bit lines 35b and the second bit line 35c constitute the pair of bit lines in the second SRAM cell 22a.

Further, a ground wiring 37 which extends laterally in the drawing plane is formed on the driver gate electrodes 25 and 25a through the inter-layer insulation film as in the case of the bit lines 35 and 35a. Electrically conductive layers (not shown) are buried in grounding contact holes 27 and 27a, so that the ground wiring 37 is connected to the diffusion layer in the first active element region 24 and the diffusion layer in the second active element region 24a through the electrically conductive layers.

Further, an inter-layer insulation film (not shown) having the word line contact holes 29 and 29a is formed on the first bit line 35, the second bit line 35a and the ground wiring 37. A word line 36 which extends in the vertical direction in the drawing plane and crosses the first bit line 35, the second bit line 35a and the ground wiring 37 is formed on the first bit line 35, the second bit line 35a and the ground wiring 37 through the inter-layer insulation film. Electrically conductive layers (not shown) are buried in the word line contact holes 29 and 29a, so that the word line 36 is connected to the first transfer gate electrode 26 and the second transfer gate electrode 26a through the electrically conductive layers.

In this way, according to this fourth embodiment, the direction in which the word line 36 extends is orthogonal to the direction in which the first bit line 35, the second bit line 35a and the ground wiring 37 extend. Further, in the second SRAM cell 22a, the word line 36a and the ground wiring 37a are connected to the transfer gate electrodes etc. in the same manner as in the case of the first SRAM cell 21a.

The first bit line 35, the second bit line 35a and the ground wiring 37 are formed by patterning the same electrically conductive layer. As the electrically conductive layer, for instance, a metal film composed of aluminum or a aluminum alloy or a high-melting metal film composed of tungsten or the like can be pointed out. Further, the word line 36 is also formed of, for instance, a metal film composed of aluminum or aluminum alloy or a refractory metal film composed of tungsten or the like.

The word line may alternatively be formed as a layer laying beneath the bit lines and the ground wiring through an inter-layer insulation film.

Furthermore, through not shown, a power supply wiring is formed in the same manner as in the case of the conventional SRAM cell. For instance, the power supply wiring etc. are formed as layers lying beneath the bit lines 35, 35a, 35b and 35c mentioned above. A load resistor element (not shown) is connected to the portion of the first active element region 24 which lies between the first driver gate electrode 25 and the first transfer gate electrode 26. Another load resistor element (not shown) is connected to the portion of the first active element region 24a which lies between the first driver gate electrode 25a and the first transfer gate electrode 26a.

In the case of the thus formed SRAM cells according to the fourth embodiment, only one word line 36 is provided in each SRAM cell. Therefore, the miniaturization in size of the SRAM cell can be made very easily.

Further, since the ground wiring 37, the first bit line 35 and the second bit line 35a are formed of the same electrically conductive layer, the parasitic capacitance, due to the bit lines in the whole SRAM cell is reduced to a substantial degree, and thus, the enhancement in the operating speed of the semiconductor device comprising the SRAM cells according to this embodiment can be realized very easily.

It should be noted that a word line might be formed in a layer beneath a layer in which bit lined are formed.

Further, the present invention is not limited only to the case where load resistor elements are used as the load elements, but can achieve the same effect also in the case where MOS transistors are used as the load elements.

What is claimed is:

1. Static memory cell with a pair of transfer MOS transistors, a pair of driver MOS transistors and a pair of load elements, comprising
   a first driver MOS transistor formed at the surface of a semiconductor substrate;
   a second driver MOS transistor formed at the surface of said semiconductor substrate;
   a first load element connected to the drain region of said first driver MOS transistor and the gate electrode of said second driver MOS transistor;
   a second load element connected to the drain region of said second driver MOS transistor and the gate electrode of said first driver MOS transistor; said first driver MOS transistor, said second driver MOS transistor, said first load element, and said second load element constituting a flip-flop circuit,
   a first transfer MOS transistor formed at the surface of said semiconductor substrate, one of the source and drain regions of said first transfer MOS transistor being connected to the drain region of said first driver MOS transistor;
   a second transfer MOS transistor formed at the surface of said semiconductor substrate, one of the source and drain regions of said second transfer MOS transistor being connected to the drain region of said second driver MOS transistor;
   an inter-layer insulation film formed on said first driver MOS transistor, said second driver MOS transistor, said first transfer MOS transistor, and said second transfer MOS transistor;
   a first bit line formed on said inter-layer insulation film, said first bit line being connected to the other of the source and drain regions of said first transfer MOS transistor;
   a second bit line formed on said inter-layer insulation film, said second bit line being connected to the other of the source and drain regions of said second transfer MOS transistor; and
   a word line formed on said inter-layer insulation film, said word line being connected to the gate electrode of said first transfer MOS transistor and the gate electrode of said second transfer MOS transistor.

2. Static memory cell according to claim 1, wherein
   said first driver MOS transistor and said second driver MOS transistor are disposed substantially point-symmetrically with reference to a point of symmetry,
   said first transfer MOS transistor and said second transfer MOS transistor are disposed substantially point-symmetrically with reference to said point of symmetry,
   said first load element and said second load element are disposed substantially point-symmetrically with reference to said point of symmetry, and
   said first bit line and said second bit line are disposed substantially point-symmetrically with reference to said point of symmetry.

3. Static memory cell according to claim 1, which further comprising a ground wiring formed of the same electrically conductive layer constituting said word line, and connected to the source region of said first driver MOS transistor and the source region of said second driver MOS transistor.

4. Static memory cell according to claim 1, which further comprising a ground wiring formed of the same electrically conductive layer constituting said first bit line and said second bit line, and connected to the source region of said first driver MOS transistor and the source region of said second driver MOS transistor.

5. Static memory cell according to claim 1, which further comprising:
   a first active element region, said first active element region
      being formed beneath the gate electrode of said first driver MOS transistor and the gate electrode of said first transfer MOS transistor,
      having the source region and the drain region of said first driver MOS transistor and the source and drain regions of said first transfer MOS transistor, and
      extending in a direction inclined with respect to the direction in which said word line extends, the direction in which said first bit line extends and the direction in which said second bit line extends; and
   a second active element region, said second active element region
      being formed beneath the gate electrode of said second driver MOS transistor and the gate electrode of said second transfer MOS transfer,
      having the source region and the drain region of said second driver MOS transistor and the source and drain regions of said second transfer MOS transistor, and
      extending in a direction inclined with respect to the direction in which said word line extends, the direction in which said first bit line extends and the direction in which said second bit line extends.

6. Static memory cell according to claim 5, wherein
the direction in which the gate electrode of said first driver MOS transistor extends, the direction in which the gate electrode of said second driver MOS transistor extends, the direction in which the gate electrode of said first transfer MOS transistor extends, and the direction in which the gate electrode of said second transfer MOS transistor extends are substantially orthogonal to the direction in which said first active element region extends and the direction in which said second active element region extends.

7. Static memory cell according to claim 1, wherein the direction in which said word line extends is substantially orthogonal to the direction in which said first bit line extends and the direction in which said second bit line extends.

8. Static memory cell according to claim 3, wherein the direction in which said ground wiring extends is substantially parallel to the direction in which said word line extends.

9. Static memory cell according to claim 4, wherein the direction in which said ground wiring extends is substantially orthogonal to the direction in which said word line extends.

10. Static memory cell according to claim 1, wherein said word line, said first bit line and said second bit line are formed of a metal selected from the group consisting of aluminum, aluminum alloys and tungsten.

11. Static memory cell according to claim 5, wherein
said first active element region and said second active element region extends in a direction inclined substantially by 45° with respect to the direction in which said word line extends, the direction in which said first bit line extends and the direction in which said second bit line extends.

12. Static memory cell according to claim 3, wherein said ground wiring is formed of a metal selected from the group consisting of aluminum, aluminum alloys and tungsten.

13. Static memory cell according to claim 4, wherein said ground wiring is formed of a metal selected from the group consisting of aluminum, aluminum alloys and tungsten.

14. Static memory cell according to claim 1, wherein said first bit line and said second bit line are formed in a layer beneath a layer in which said word line is formed.

15. Static memory cell according to claim 1, wherein said word line is formed in a layer beneath a layer in which said first bit line and said second bit line are formed.

16. A semiconductor device comprising:
a plurality of MOS transistors disposed on a semiconductor substrate and connected to form a memory cell;
at least one bit line operatively coupled to a portion of said memory cell;
a single word line operatively connected to said memory cell to enable a transfer of information between said at least one bit line and said memory cell; and
ground wiring operatively coupled to said memory cell and disposed substantially perpendicular to said at least one bit line, wherein said ground wiring is operatively coupled to said memory cell and disposed substantially coplanar to said single word line and said at least one bit line, said ground wiring being electrically isolated from said word line and said at least one bit line.

17. The semiconductor device of claim 16, further comprising:
ground wiring operatively coupled to said memory cell and disposed substantially coplaner to said at least one bit line, said ground wiring being electrically isolated from said at least one bit line.

18. The semiconductor device of claim 16, wherein said at least one bit line extends in a direction that is substantially perpendicular to said single word line.

19. The semiconductor device of claim 16, wherein said memory cell includes first and second driver transistors, first and second transfer transistors and first and second load elements, said first load element connected to the source regions of the first driver transistor and of the first transfer transistor and to the gate region of the second driver transistor, said second load element connected to the source regions of the second driver transistor and of the second transfer transistor and to the gate region of the first driver transistor, said driver transistors and said load elements forming a flip-flop circuit, wherein the gates of the first and second transfer transistors are connected to each other and to the single word line and wherein the drains of each of the first and second transfer transistors are connected to a respective one of said at least one bit line.

20. The semiconductor device of claim 16, wherein said each of said plurality of MOS transistors has an active element region having respective source and drain regions and wherein said active element region extends in a direction which is inclined by substantially 45 degrees with respect to a direction of said at least one bit line.

21. The semiconductor device of claim 20, further comprising:
gate electrodes connected to gates of each of said plurality of MOS transistors, wherein said gate electrodes extend in a direction which is substantially perpendicular to the direction of said active element regions.

* * * * *